United States Patent
Zhang et al.

(10) Patent No.: US 12,484,279 B2
(45) Date of Patent: Nov. 25, 2025

(54) SEMICONDUCTOR DEVICE

(71) Applicant: INNOSCIENCE (ZHUHAI) TECHNOLOGY CO., LTD., Zhuhai (CN)

(72) Inventors: Anbang Zhang, Zhuhai (CN); King Yuen Wong, Zhuhai (CN)

(73) Assignee: INNOSCIENCE (ZHUHAI) TECHNOLOGY CO., LTD., Zhuhai (CN)

(*) Notice: Subject to any disclaimer, the term of this patent is extended or adjusted under 35 U.S.C. 154(b) by 93 days.

(21) Appl. No.: 18/664,195

(22) Filed: May 14, 2024

(65) Prior Publication Data

US 2024/0304683 A1    Sep. 12, 2024

Related U.S. Application Data

(62) Division of application No. 16/968,875, filed as application No. PCT/CN2020/099172 on Jun. 30, 2020, now Pat. No. 12,021,122.

(51) Int. Cl.
*H10D 64/00* (2025.01)
*H01L 23/31* (2006.01)
(Continued)

(52) U.S. Cl.
CPC ....... *H10D 64/118* (2025.01); *H01L 23/3171* (2013.01); *H01L 23/3192* (2013.01);
(Continued)

(58) Field of Classification Search
CPC .. H10D 64/118; H10D 30/015; H10D 30/475; H10D 62/824; H10D 62/8503;
(Continued)

(56) References Cited

U.S. PATENT DOCUMENTS 10,312,207 B2 *   6/2019   Chang ................... H01L 24/03
11,302,786 B2 *   4/2022   Wong ................... H10D 64/411
(Continued)

FOREIGN PATENT DOCUMENTS

CN   102810564   12/2012
CN   106298882   1/2017
(Continued)

OTHER PUBLICATIONS

ISA State Intellectual Property Office of the People's Republic of China, International Search Report Issued in Application No. PCT/CN2020/099172, Mar. 25, 2021, WIPO, 4 pages.
(Continued)

*Primary Examiner* — Douglas W Owens
(74) *Attorney, Agent, or Firm* — JCIPRNET

(57) ABSTRACT

Some embodiments of the disclosure provide a semiconductor device. The semiconductor device comprises: a substrate; a first nitride semiconductor layer on the substrate; a second nitride semiconductor layer on the first nitride semiconductor layer and having a band gap greater than a band gap of the first nitride semiconductor layer; a group III-V dielectric layer disposed on the second nitride semiconductor layer; a gate electrode disposed on the second nitride semiconductor layer; and a first passivation layer disposed on the group III-V dielectric layer, wherein the group III-V dielectric layer is separated from the gate electrode by the first passivation layer.

5 Claims, 12 Drawing Sheets

(51) Int. Cl.
*H10D 30/01* (2025.01)
*H10D 30/47* (2025.01)
*H10D 62/824* (2025.01)
*H10D 62/85* (2025.01)
*H10D 64/27* (2025.01)

(52) U.S. Cl.
CPC ......... *H10D 30/015* (2025.01); *H10D 30/475* (2025.01); *H10D 62/824* (2025.01); *H10D 62/8503* (2025.01); *H10D 64/411* (2025.01)

(58) Field of Classification Search
CPC .... H10D 64/411; H10D 62/10; H10D 62/124; H10D 30/4732; H01L 3/3171; H01L 23/3192; H01L 23/291
See application file for complete search history.

(56) References Cited

U.S. PATENT DOCUMENTS

| | | | | |
|---|---|---|---|---|
| 2008/0128752 A1* | 6/2008 | Wu | ...................... | H10D 30/015 257/E29.127 |
| 2012/0149161 A1 | 6/2012 | Ohki et al. | | |
| 2014/0061659 A1* | 3/2014 | Teplik | .................. | H10D 30/015 257/E21.403 |
| 2014/0264451 A1 | 9/2014 | Ozaki et al. | | |
| 2015/0060873 A1 | 3/2015 | Chiu et al. | | |

FOREIGN PATENT DOCUMENTS

| | | |
|---|---|---|
| CN | 106549051 | 3/2017 |
| CN | 107623030 | 1/2018 |
| CN | 110556296 | 12/2019 |
| JP | 2013225621 | 10/2013 |

OTHER PUBLICATIONS

ISA State Intellectual Property Office of the People's Republic of China, Written Opinion of the International Searching Authority Issued in Application No. PCT/CN2020/099172, Mar. 25, 2021, WIPO, 4 pages.

State Intellectual Property Office of the People's Republic of China, Office Action and Search Report Issued in Application No. 2020800015072, Jun. 8, 2023, with English translation thereof, 15 pages.

State Intellectual Property Office of the People's Republic of China, Notice of Allowance Issued in Application No. 2020800015072, Jan. 6, 2024, with English translation thereof, 4 pages.

* cited by examiner

SEMICONDUCTOR DEVICE

CROSS-REFERENCE TO RELATED APPLICATIONS

This application is a divisional application of U.S. patent application Ser. No. 16/968,875, filed on Aug. 11, 2020, which is a national stage of International Application No. PCT/CN2020/099172, filed on Jun. 30, 2020. All of the aforementioned patent applications are hereby incorporated by reference in their entireties.

BACKGROUND

1. Technical Field

The disclosure is related to a semiconductor device, and in particular, to a semiconductor device including a high-electron-mobility transistor (HEMT).

2. Description of the Related Art

A semiconductor component including a direct band gap, for example, a semiconductor component including a group III-V material or group III-V compounds, may operate or work under a variety of conditions or environments (for example, different voltages or frequencies) due to its characteristics.

The foregoing semiconductor component may include a HEMT, a heterojunction bipolar transistor (HBT), a heterojunction field effect transistor (HFET), or a modulation-doped field effect transistor (MODFET).

SUMMARY

Some embodiments of the disclosure provide a semiconductor device. The semiconductor device comprises: a substrate; a first nitride semiconductor layer on the substrate; a second nitride semiconductor layer on the first nitride semiconductor layer and having a band gap greater than a band gap of the first nitride semiconductor layer; a group III-V dielectric layer disposed on the second nitride semiconductor layer; a gate electrode disposed on the second nitride semiconductor layer; and a first passivation layer disposed on the group III-V dielectric layer, wherein the group III-V dielectric layer is separated from the gate electrode by the first passivation layer.

Some embodiments of the disclosure provide a semiconductor device. The semiconductor device comprises: a substrate; a first nitride semiconductor layer on the substrate; a second nitride semiconductor layer on the first nitride semiconductor layer and having a band gap greater than a band gap of the first nitride semiconductor layer; a gate electrode having a first portion with a first length and in direct contact with the second nitride semiconductor layer, and a second portion with a second length different from the first length and on the first portion; and a passivation layer disposed on the second nitride semiconductor layer, wherein the first length and the second length are measured in a channel length direction, and wherein the passivation layer has a sidewall in direct contact with the second nitride semiconductor layer, the first portion of the gate electrode and the second portion of the gate electrode.

Some embodiments of the disclosure provide a method for fabricating a semiconductor device. The method comprises: providing a substrate; forming a first nitride semiconductor layer on the substrate; forming a second nitride semiconductor layer having a band gap larger than a band gap of the first nitride semiconductor layer on the first nitride semiconductor layer; forming a group III-V dielectric layer on the second nitride semiconductor layer; forming a first passivation layer on the group III-V dielectric layer and on the second nitride semiconductor layer; and forming a gate electrode on the second nitride semiconductor layer by removing a portion of the first passivation layer, wherein the group III-V dielectric layer is separated from the gate electrode by the first passivation layer.

BRIEF DESCRIPTION OF THE DRAWINGS

Aspects of the disclosure will become more comprehensible from the following detailed description made with reference to the accompanying drawings. It should be noted that, various features may not be drawn to scale. In fact, the sizes of the various features may be increased or reduced arbitrarily for the purpose of clear description.

DETAILED DESCRIPTION

Figure 1A:
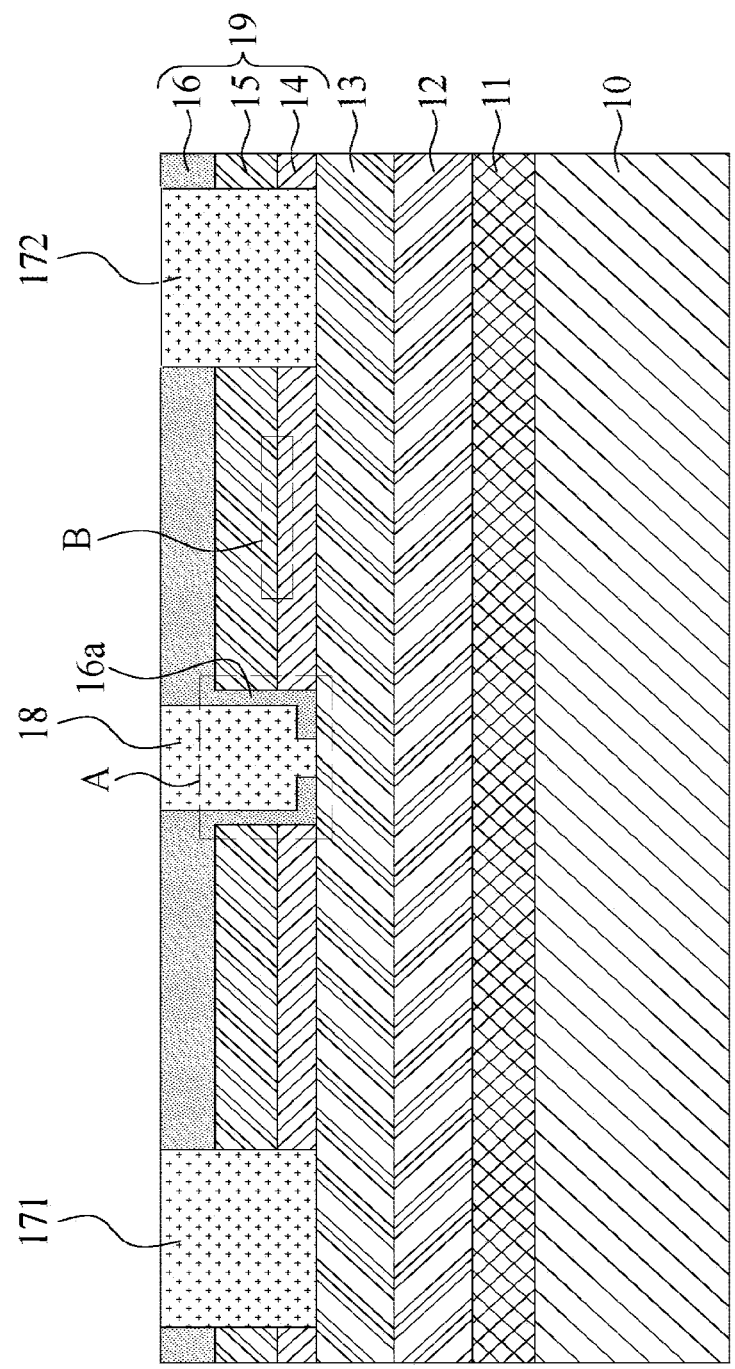
FIG. 1A is a side view of a semiconductor device according to some embodiments of the disclosure.

The following disclosure provides many different embodiments or examples for implementing different features of the provided subject matter. Specific examples of components and arrangements are described below. Certainly, these descriptions are merely examples and are not intended to be limiting. In the disclosure, in the following descriptions, the description of the first feature being formed on or above the second feature may include an embodiment in which the first feature and the second feature are formed to be in direct contact, and may further include an embodiment in which an additional feature may be formed between the first feature and the second feature to enable the first feature and the second feature to be not in direct contact. In addition, in the disclosure, reference numerals and/or letters may be repeated in examples. This repetition is for the purpose of simplification and clarity, and does not indicate a relationship between the described various embodiments and/or configurations.

The embodiments of the disclosure are described in detail below. However, it should be understood that many applicable concepts provided by the disclosure may be implemented in a plurality of specific environments. The described specific embodiments are only illustrative and do not limit the scope of the disclosure.

A direct band gap material, such as a group III-V compound, may include but is not limited to, for example, gallium arsenide (GaAs), indium phosphide (InP), gallium nitride (GaN), Indium gallium arsenide (InGaAs), Indium aluminum arsenide (InAlAs), and the like.

FIG. 1A is a side view of a semiconductor device 1 according to some embodiments of the disclosure.

As shown in FIG. 1A, the semiconductor device 1 may include a substrate 10, a buffer layer 11, a semiconductor layer 12, a semiconductor layer 13, a group III-V dielectric layer 14, a passivation layer 15, a passivation layer 16, a conductive structure 171, a conductive structure 172 and a conductive structure 18. The structure within the dotted rectangle A is further illustrated in FIG. 1B. The structure within the dotted rectangle B is further illustrated in FIG. 1C.

The substrate 10 may include, for example, but is not limited to, silicon (Si), doped silicon (doped Si), silicon carbide (SiC), germanium silicide (SiGe), gallium arsenide (GaAs), or another semiconductor material. In some embodiments, the substrate 10 may include an intrinsic semiconductor material. In some embodiments, the substrate 10 may include a p-type semiconductor material. In some embodiments, the substrate 10 may include a silicon layer doped with boron (B). In some embodiments, the substrate 10 may include a silicon layer doped with gallium (Ga). In some embodiments, the substrate 10 may include an n-type semiconductor material. In some embodiments, the substrate 10 may include a silicon layer doped with arsenic (As). In some embodiments, the substrate 10 may include a silicon layer doped with phosphorus (P).

The buffer layer 11 may be disposed on the substrate 10. In some embodiments, the buffer layer 11 may include nitrides. In some embodiments, the buffer layer 11 may include, for example, but is not limited to, aluminum nitride (AlN). In some embodiments, the buffer layer 11 may include, for example, but is not limited to, aluminum gallium nitride (AlGaN). The buffer layer 11 may include a multi-layer structure. The buffer layer 11 may include a superlattice layer with periodic structure of two or more materials. The buffer layer 11 may include a single layer structure.

The semiconductor layer 12 may be disposed on the buffer layer 11. The semiconductor layer 12 may include group III-V materials. The semiconductor layer 12 may be a nitride semiconductor layer. The semiconductor layer 12 may include, for example, but is not limited to, group III nitride. The semiconductor layer 12 may include, for example, but is not limited to, GaN. The semiconductor layer 12 may include, for example, but is not limited to, AlN. The semiconductor layer 12 may include, for example, but is not limited to, InN. The semiconductor layer 12 may include, for example, but is not limited to, compound $In_xAl_yGa_{1-x-y}N$, where $x+y\leq1$. The semiconductor layer 12 may include, for example, but is not limited to, compound $Al_yGa_{(1-y)}N$, where $y\leq1$.

The semiconductor layer 13 may be disposed on the semiconductor layer 12. The semiconductor layer 13 may include group III-V materials. The semiconductor layer 13 may be a nitride semiconductor layer. The semiconductor layer 13 may include, for example, but is not limited to, group III nitride. The semiconductor layer 13 may include, for example, but is not limited to, compound $Al_yGa_{(1-y)}N$, where $y\leq1$. The semiconductor layer 13 may include, for example, but is not limited to, GaN. The semiconductor layer 13 may include, for example, but is not limited to, AlN. The semiconductor layer 13 may include, for example, but is not limited to, InN. The semiconductor layer 13 may include, for example, but is not limited to, compound $In_xAl_yGa_{1-x-y}N$, where $x+y\leq1$.

A heterojunction may be formed between the semiconductor layer 13 and the semiconductor layer 12. The semiconductor layer 13 may have a band gap greater than a band gap of the semiconductor layer 12. For example, the semiconductor layer 13 may include AlGaN that may have a band gap of about 4 eV, and the semiconductor layer 12 may include GaN that may have a band gap of about 3.4 eV.

In the semiconductor device 1, the semiconductor layer 12 may be used as a channel layer.

In the semiconductor device 1, the semiconductor layer 12 may be used as a channel layer disposed on the buffer layer 11. In the semiconductor device 1, the semiconductor layer 13 may be used as a barrier layer. In the semiconductor device 1, the semiconductor layer 13 may be used as a barrier layer disposed on the semiconductor layer 12.

In the semiconductor device 1, because the band gap of the semiconductor layer 12 is less than the band gap of the semiconductor layer 13, two dimensional electron gas (2DEG) may be formed in the semiconductor layer 12. In the semiconductor device 1, because the band gap of the semiconductor layer 12 is less than the band gap of the semiconductor layer 13, 2DEG may be formed in the semiconductor layer 12 and the 2DEG is close to the interface of the semiconductor layer 13 and the semiconductor layer 12. In the semiconductor device 1, because the band gap of the semiconductor layer 13 is greater than the band gap of the semiconductor layer 12, 2DEG may be formed in the semiconductor layer 12. In the semiconductor device 1, because the band gap of the semiconductor layer 13 is greater than the band gap of the semiconductor layer 12, 2DEG may be formed in the semiconductor layer 12 and the 2DEG is close to the interface of the semiconductor layer 13 and the semiconductor layer 12.

The group III-V dielectric layer 14 may be disposed on the semiconductor layer 13. The group III-V dielectric layer 14 may be in direct contact with the semiconductor layer 13. The group III-V dielectric layer 14 may separate the conductive structure 18 from the conductive structure 171. The group III-V dielectric layer 14 may separate the conductive structure 18 from the conductive structure 172. The group III-V dielectric layer 14 may include nitride. The group III-V dielectric layer 14 may include, for example, but is not limited to, AlN. The group III-V dielectric layer 14 may include, for example, but is not limited to, boron nitride (BN). The group III-V dielectric layer 14 may electrically isolate the conductive structure 18. The group III-V dielectric layer 14 may electrically isolate the conductive structure 171. The group III-V dielectric layer 14 may electrically isolate the conductive structure 172. The group III-V dielectric layer 14 may have a thickness between approximately 1 nm and approximately 10 nm. The group III-V dielectric layer 14 may have a thickness between approximately 3 nm and approximately 8 nm. The group III-V dielectric layer 14 may have a thickness of about 5 nm.

The passivation layer 15 may be disposed on the semiconductor layer 13. The passivation layer 15 may extend on the semiconductor layer 13. The passivation layer 15 may be disposed on the group III-V dielectric layer 14. The passivation layer 15 may cover the group III-V dielectric layer 14. The passivation layer 15 may extend along the group III-V dielectric layer 14. The passivation layer 15 may be in direct contact with the group III-V dielectric layer 14. The passivation layer 15 may separate the conductive structure 18 from the conductive structure 171. The passivation layer 15 may separate the conductive structure 18 from the conductive structure 172. The passivation layer 15 may include a dielectric material. The passivation layer 15 may include a non-group III-V dielectric material. The passivation layer 15 may include nitride. The passivation layer 15 may include, for example, but is not limited to, silicon nitride ($Si_3N_4$). The passivation layer 15 may include oxide. The passivation layer 15 may include, for example, but is not limited to, silicon oxide ($SiO_2$). The passivation layer 15 may electrically isolate the conductive structure 18. The passivation layer 15 may electrically isolate the conductive structure 171. The passivation layer 15 may electrically isolate the conductive structure 172. The passivation layer 15 may have a thickness between approximately 10 nm and approximately 100 nm. The passivation layer 15 may have a thickness between approximately 30 nm and approximately 70 nm. The passivation layer 15 may have a thickness of about 50 nm.

The passivation layer 16 may be disposed on the semiconductor layer 13. The passivation layer 16 may extend on the semiconductor layer 13. The passivation layer 16 may be disposed on the group III-V dielectric layer 14. The passivation layer 16 may cover the group III-V dielectric layer 14. The passivation layer 16 may cover the sidewall of the group III-V dielectric layer 14. The passivation layer 16 may extend along the group III-V dielectric layer 14. The passivation layer 16 may surround the group III-V dielectric layer 14. The passivation layer 16 may be in direct contact with the group III-V dielectric layer 14. The passivation layer 16 may be in direct contact with the sidewall of the group III-V dielectric layer 14. The passivation layer 16 may be disposed on the passivation layer 15. The passivation layer 16 may cover the passivation layer 15. The passivation layer 16 may cover the sidewall of the passivation layer 15. The passivation layer 16 may extend along the passivation layer 15. The passivation layer 16 may surround the passivation layer 15. The passivation layer 16 may be in direct contact with the passivation layer 15. The passivation layer 16 may be in direct contact with the sidewall of the passivation layer 15. The passivation layer 16 may be in direct contact with the conductive structure 18. The passivation layer 16 may separate the conductive structure 18 from the conductive structure 171. The passivation layer 16 may separate the conductive structure 18 from the conductive structure 172. The passivation layer 16 may separate the conductive structure 18 from the group III-V dielectric layer 14. The passivation layer 16 may separate the conductive structure 18 from the passivation layer 15. The passivation layer 16 may include a dielectric material. The passivation layer 16 may include a non-group III-V dielectric material. The passivation layer 16 may include nitride. The passivation layer 16 may include, for example, but is not limited to, $Si_3N_4$. The passivation layer 16 may include oxide. The passivation layer 16 may include, for example, but is not limited to, $SiO_2$. The passivation layer 16 may electrically isolate the conductive structure 18. The passivation layer 16 may electrically isolate the conductive structure 171. The passivation layer 16 may electrically isolate the conductive structure 172. The passivation layer 16 may have a thickness between approximately 1 nm and approximately 100 nm. The passivation layer 16 may have a thickness between approximately 30 nm and approximately 70 nm. The passivation layer 16 may have a thickness of about 50 nm.

The passivation layer 16 may further include a portion 16a. The portion 16a may be disposed on the semiconductor layer 13. The portion 16a may be in direct contact with the semiconductor layer 13. The portion 16a may be in direct contact with the group III-V dielectric layer 14. The portion 16a may have a sidewall in direct contact with the group III-V dielectric layer 14. The portion 16a may be in direct contact with the passivation layer 15. The portion 16a may have a sidewall in direct contact with the passivation layer 15. The portion 16a may be in direct contact with the conductive structure 18. The portion 16a may have a sidewall in direct contact with the conductive structure 18. The portion 16a may separate the conductive structure 18 from the group III-V dielectric layer 14. The portion 16a may be between the conductive structure 18 and the group III-V dielectric layer 14. The portion 16a may separate the conductive structure 18 from the passivation layer 15. The portion 16a may be between the conductive structure 18 and the passivation layer 15.

The passivation layer 16 may have a different material from that of the group III-V dielectric layer 14. The passivation layer 16 may have a different material from that of the passivation layer 15. The passivation layer 16 may have a material identical to that of the passivation layer 15. As the passivation layer 16 and the passivation layer 15 have the same material, the passivation layer 16 and the passivation layer 15 may be regarded as one single layer. For example, the group III-V dielectric layer 14 may include AlN, the passivation layer 15 may include $SiO_2$ and the passivation layer 16 may include $Si_3N_4$. For example, the group III-V dielectric layer 14 may include AlN, the passivation layer 15 may include $Si_3N_4$ and the passivation layer 16 may include $Si_3N_4$. For example, the group III-V dielectric layer 14 may include AlN, the passivation layer 15 may include $SiO_2$ and the passivation layer 16 may include $SiO_2$. For example, the group III-V dielectric layer 14 may include BN, the passivation layer 15 may include $SiO_2$ and the passivation layer 16 may include $Si_3N_4$. For example, the group III-V dielectric layer 14 may include BN, the passivation layer 15 may include $Si_3N_4$ and the passivation layer 16 may include $Si_3N_4$. For example, the group III-V dielectric layer 14 may include BN, the passivation layer 15 may include $SiO_2$ and the passivation layer 16 may include $SiO_2$.

The conductive structure 171 may be disposed on the semiconductor layer 13. The conductive structure 171 may contact the semiconductor layer 13. The conductive structure 171 may be electrically connected to the semiconductor layer 12. The conductive structure 171 may be electrically connected to the semiconductor layer 12 through the semiconductor layer 13. The conductive structure 171 may be surrounded by the group III-V dielectric layer 14. The conductive structure 171 may be surrounded by the passivation layer 15. The conductive structure 171 may be surrounded by the passivation layer 16. The conductive structure 171 may include a conductive material. The conductive structure 171 may include a metal. The conductive structure 171 may include, for example, but is not limited to, Al. The conductive structure 171 may include, for example, but is not limited to, Ti. The conductive structure 171 may include a metal compound. The conductive structure 171 may include, for example, but is not limited to, titanium nitride (TiN).

The conductive structure 172 may be disposed on the semiconductor layer 13. The conductive structure 172 may contact the semiconductor layer 13. The conductive structure 172 may be electrically connected to the semiconductor layer 12. The conductive structure 172 may be electrically connected to the semiconductor layer 12 through the semiconductor layer 13. The conductive structure 172 may be surrounded by the group III-V dielectric layer 14. The conductive structure 172 may be surrounded by the passivation layer 15. The conductive structure 172 may be surrounded by the passivation layer 16. The conductive structure 172 may include a conductive material. The conductive structure 172 may include a metal. The conductive structure 172 may include, for example, but is not limited to, Al. The conductive structure 172 may include, for example, but is not limited to, Ti. The conductive structure 172 may include a metal compound. The conductive structure 172 may include, for example, but is not limited to, AlN. The conductive structure 172 may include, for example, but is not limited to, TiN.

In the semiconductor device 1, the conductive structure 171 may be used as, for example, but is not limited to, a source electrode. In the semiconductor device 1, the conductive structure 171 may be used as, for example, but is not limited to, a drain electrode.

In the semiconductor device 1, the conductive structure 172 may be used as, for example, but is not limited to, a drain electrode. In the semiconductor device 1, the conductive structure 172 may be used as, for example, but is not limited to, a source electrode.

The conductive structure 18 may be disposed on the semiconductor layer 13. The conductive structure 18 may be in direct contact with the semiconductor layer 13. The conductive structure 18 may be surrounded by the passivation layer 16. The conductive structure 18 may be separated from the group III-V dielectric layer 14. The conductive structure 18 may be separated from the group III-V dielectric layer 14 by the passivation layer 16. The conductive structure 18 may include a metal. The conductive structure 18 may include, for example, but is not limited to, gold (Au), platinum (Pt), titanium (Ti), palladium (Pd), nickel (Ni), or tungsten (W). The conductive structure 18 may include a metal compound. The conductive structure 18 may include, for example, but is not limited to, TiN.

In the semiconductor device 1, the conductive structure 18 may be used as a gate electrode. In the semiconductor device 1, the conductive structure 18 may be configured to control the 2DEG in the semiconductor layer 12. In the semiconductor device 1, a voltage may be applied to the conductive structure 18 to control the 2DEG in the semiconductor layer 12. In the semiconductor device 1, a voltage may be applied to the conductive structure 18 to control the 2DEG in the semiconductor layer 12 and below the conductive structure 18. In the semiconductor device 1, a voltage may be applied to the conductive structure 18 to control the connection or disconnection between the conductive structure 171 and the conductive structure 172.

It should be noted that, the conductive structure 171 may be used as a source electrode of the semiconductor device 1, the conductive structure 172 may be used as a drain electrode of the semiconductor device 1, and the conductive structure 18 may be used as a gate electrode of the semiconductor device 1. Although the conductive structure 171 which may be used as a source electrode and the conductive structure 172 which may be used as a drain electrode are respectively disposed on both sides of the conductive structure 18 which may be used as a gate electrode in FIG. 1A, the conductive structure 171, the conductive structure 172, and the conductive structure 18 may be disposed differently in other embodiments of the disclosure according to design requirements.

Also referring to FIG. 1A, the semiconductor device 1 may include a composite layer 19. The composite layer 19 may include the group III-V dielectric layer 14 and the passivation layer 15. The composite layer 19 may include the group III-V dielectric layer 14 and the passivation layer 16. The composite layer 19 may include the group III-V dielectric layer 14, the passivation layer 15 and the passivation layer 16. The composite layer 19 may be referred to as a hybrid layer. The composite layer 19 may be referred to as an integrated layer. The composite layer 19 may be referred to as a combined layer. The composite layer 19 may electrically isolate the conductive structure 18. The composite layer 19 may electrically isolate the conductive structure 171. The composite layer 19 may electrically isolate the conductive structure 172. In the composite layer 19, the group III-V dielectric layer 14 may be capped by the passivation layer 16. In the composite layer 19, the group III-V dielectric layer 14 may be enveloped by the passivation layer 16. In the composite layer 19, the passivation layer 15 and the passivation layer 16 may be regarded as one single layer which may cover the group III-V dielectric layer 14 when the passivation layer 15 and the passivation layer 16 include the same material.

It should be noted that, the group III-V dielectric layer 14 may improve the surface of the semiconductor layer 13. It should be noted that, the group III-V dielectric layer 14 may decrease the defects of the semiconductor layer 13. It should be noted that, the group III-V dielectric layer 14 may reduce the surface state density of the semiconductor layer 13. It should be noted that, the group III-V dielectric layer 14, compared with the passivation layer 15, may have higher polarizability. It should be noted that, the group III-V dielectric layer 14, compared with the passivation layer 16, may have higher polarizability. It should be noted that, the group III-V dielectric layer 14, compared with the passivation layer 15, may have better properties to decrease the defects of the semiconductor layer 13. It should be noted that, the group III-V dielectric layer 14, compared with the passivation layer 16, may have better properties to decrease the defects of the semiconductor layer 13. It should be noted that, due to the application of the group III-V dielectric layer 14, the surface state density of the semiconductor layer 13 may range between approximately $1010$ $cm^{-2}$ and approximately $1012$ $cm^{-2}$. It should be noted that, due to the application of the group III-V dielectric layer 14, the surface state density of the semiconductor layer 13 may range between approximately $1010$ $cm^{-2}$ and approximately $1011$ $cm^{-2}$. It should be noted that, if the group III-V dielectric layer 14 includes AlN rather than $Si_3N_4$ or $SiO_2$, the surface state density of the semiconductor layer 13 may be reduced from $1012$ $cm^{-2}$ to the range between approximately $1010$ $cm^{-2}$ and approximately $1012$ $cm^{-2}$. It should be noted that, if the group III-V dielectric layer 14 includes BN rather than $Si_3N_4$ or $SiO_2$, the surface state density of the semiconductor layer 13 may be reduced from $1012$ $cm^{-2}$ to the range between approximately $1010$ $cm^{-2}$ and approximately $1012$ $cm^{-2}$.

It should be noted that, the conduction band of the semiconductor layer 13 may vary when the group III-V dielectric layer 14 is adjacent to the semiconductor layer 13. It should be noted that, the conduction band of the semiconductor layer 13 may fall when the group III-V dielectric layer 14 is adjacent to the semiconductor layer 13. It should be noted that, a gate leakage current may be observed if the group III-V dielectric layer 14 is adjacent to the conductive structure 18 which is used as a gate electrode. It should be noted that, a gate leakage current may be observed if the group III-V dielectric layer 14 is adjacent to the conductive structure 18 which is used as a gate electrode and the semiconductor layer 13. It should be noted that, the conduction band of the semiconductor layer 13 may vary when the group III-V dielectric layer 14 is in direct contact with the semiconductor layer 13. It should be noted that, the conduction band of the semiconductor layer 13 may fall when the group III-V dielectric layer 14 is in direct contact with the semiconductor layer 13. It should be noted that, a gate leakage current may be observed if the group III-V dielectric layer 14 is in direct contact with the conductive structure 18 which is used as a gate electrode. It should be noted that, a gate leakage current may be observed if the group III-V dielectric layer 14 is in direct contact with the conductive structure 18 which is used as a gate electrode and the semiconductor layer 13. It should be noted that, a gate leakage current may be prevented or reduced if the conductive structure 18 which is used as a gate electrode is separated from the group III-V dielectric layer 14. It should be noted that, a gate leakage current may be prevented or reduced if the conductive structure 18 which is used as a gate electrode is separated from the group III-V dielectric layer 14 by the passivation layer 16. It should be noted that, a gate leakage current may be prevented or reduced if the conductive structure 18 which is used as a gate electrode and is in direct contact with the semiconductor layer 13 is separated from the group III-V dielectric layer 14 by the passivation layer 16. It should be noted that, a gate leakage current may be prevented or reduced if the conductive structure 18 which is used as a gate electrode and is in direct contact with the semiconductor layer 13 is separated from the group III-V dielectric layer 14 which is in direct contact with the semiconductor layer 13 by the passivation layer 16. It should be noted that, a gate leakage current may be prevented or reduced if the conductive structure 18 which is used as a gate electrode is isolated from the group III-V dielectric layer 14. It should be noted that, a gate leakage current may be prevented or reduced if the conductive structure 18 which is used as a gate electrode is isolated from the group III-V dielectric layer 14 by the passivation layer 16. It should be noted that, a gate leakage current may be prevented or reduced if the conductive structure 18 which is used as a gate electrode and is in direct contact with the semiconductor layer 13 is isolated from the group III-V dielectric layer 14 by the passivation layer 16. It should be noted that, a gate leakage current may be prevented or reduced if the conductive structure 18 which is used as a gate electrode and is in direct contact with the semiconductor layer 13 is isolated from the group III-V dielectric layer 14 which is in direct contact with the semiconductor layer 13 by the passivation layer 16.

Figure 1B:
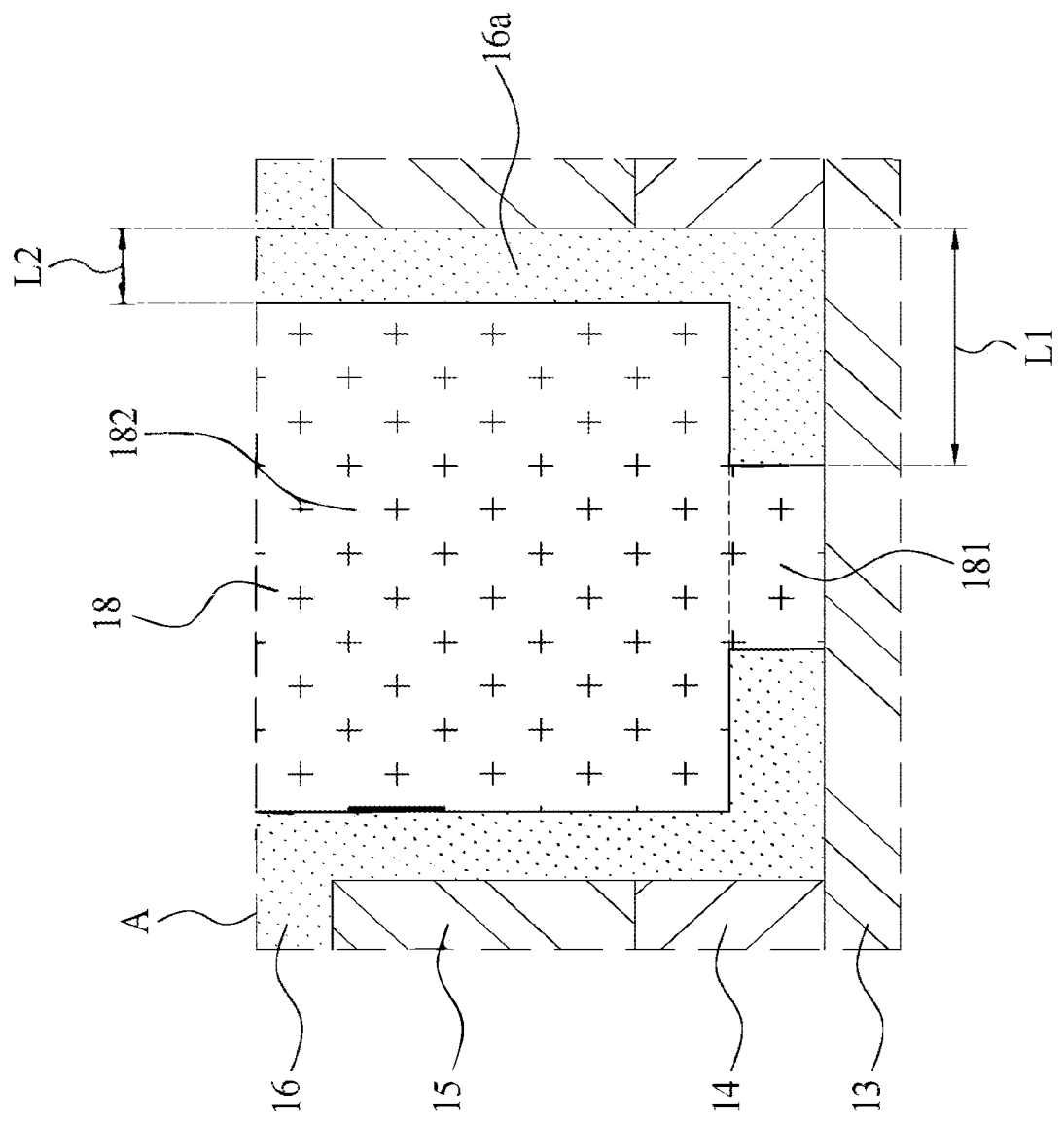
FIG. 1B is an enlarged side view of a semiconductor device according to some embodiments of the disclosure.

FIG. 1B is an enlarged side view of structure in the dotted rectangular A as shown in FIG. 1A according to some embodiments of the disclosure.

As shown in FIG. 1B, the semiconductor layer 13, the group III-V dielectric layer 14, the passivation layer 15, the passivation layer 16, and the conductive structure 18 may be included in dotted rectangular A.

The conductive structure 18 may have a portion 181 and a portion 182. The conductive structure 18 may have a step shape structure. The portion 181 may be disposed on the semiconductor layer 13. The portion 181 may be in direct contact with the semiconductor layer 13. The portion 182 may be disposed on the semiconductor layer 13. The portion 182 may be disposed on the portion 181. The portion 182 may be in direct contact with the portion 181. The portion 181 may have a shape different from that of the portion 182. The portion 181 may have a profile different from that of the portion 182. The portion 181 may have a length different from that of the portion 182. The portion 181 may have a length different from that of the portion 182, wherein the length of the portion 181 and the length of the portion 182 may be measured in a channel length direction. The portion 181 may have a length different from that of the portion 182, wherein the length of the portion 181 and the length of the portion 182 may be measured in a direction of carriers, such as electrons, passing from the source to the drain. The portion 181 may have a length different from that of the portion 182, wherein the length of the portion 181 and the length of the portion 182 may be measured in a direction of carriers, such as holes, passing from the source to the drain. The portion 181 may have a length less than that of the portion 182. The portion 181 may have a length no greater than that of the portion 182.

The passivation layer 16 may have a portion 16a. The portion 16a may be in direct contact with the conductive structure 18. The portion 16a may have a sidewall in direct contact with the conductive structure 18. The portion 16a may be in direct contact with the portion 181. The portion 16a may have a sidewall in direct contact with the portion 181. The portion 16a may be in direct contact with the portion 182. The portion 16a may have a sidewall in direct contact with the portion 182. The portion 16a may have a length L1 between the conductive structure 18 and the group III-V dielectric layer 14. The portion 16a may have a length L1 between the portion 181 and the group III-V dielectric layer 14. The portion 16a may have a length L2 between the conductive structure 18 and the group III-V dielectric layer 14. The portion 16a may have a length L2 between the portion 182 and the group III-V dielectric layer 14. The portion 16a may have a length L2 between the conductive structure 18 and the passivation layer 15. The portion 16a may have a length L2 between the portion 182 and the passivation layer 15.

The length L1 may be different from the length L2. The length L1 may be longer than the length L2. The length L1 may be identical to the length L2. The length L1 and the length L2 may be measured in a channel length direction. The length L1 and the length L2 may be measured in a direction of carriers, such as electrons, passing from the source to the drain. The length L1 and the length L2 may be measured in a direction of carriers, such as holes, passing from the source to the drain. The length L1 may range between approximately 10 nm and approximately 500 nm. The length L1 may preferably range between approximately 100 nm and approximately 500 nm. The length L1 may preferably range between approximately 200 nm and approximately 500 nm. The length L1 may preferably range between approximately 300 nm and approximately 500 nm. The length L2 may range between approximately 1 nm and approximately 100 nm. The length L1 may preferably range between approximately 10 nm and approximately 90 nm. The length L1 may preferably range between approximately 30 nm and approximately 70 nm. The length L1 may preferably range between approximately 40 nm and approximately 60 nm.

It is contemplated that, the length L1 is long enough to prevent or suppress the influence of the group III-V dielectric layer 14 towards the conductive structure 18. It is contemplated that, the length L1 is long enough to prevent or suppress the influence of the group III-V dielectric layer 14 towards the portion 181. It is contemplated that, the length L1 is long enough to prevent or suppress the influence of the group III-V dielectric layer 14 towards the portion 181, which is in direct contact with the semiconductor layer 13. It is contemplated that, the length L1 is long enough to prevent or suppress a gate leakage current when the conductive structure 18 is used as a gate electrode. It is contemplated that, the length L1 is long enough to prevent or suppress a gate leakage current when the portion 181 is used as a gate electrode.

Figure 1C:
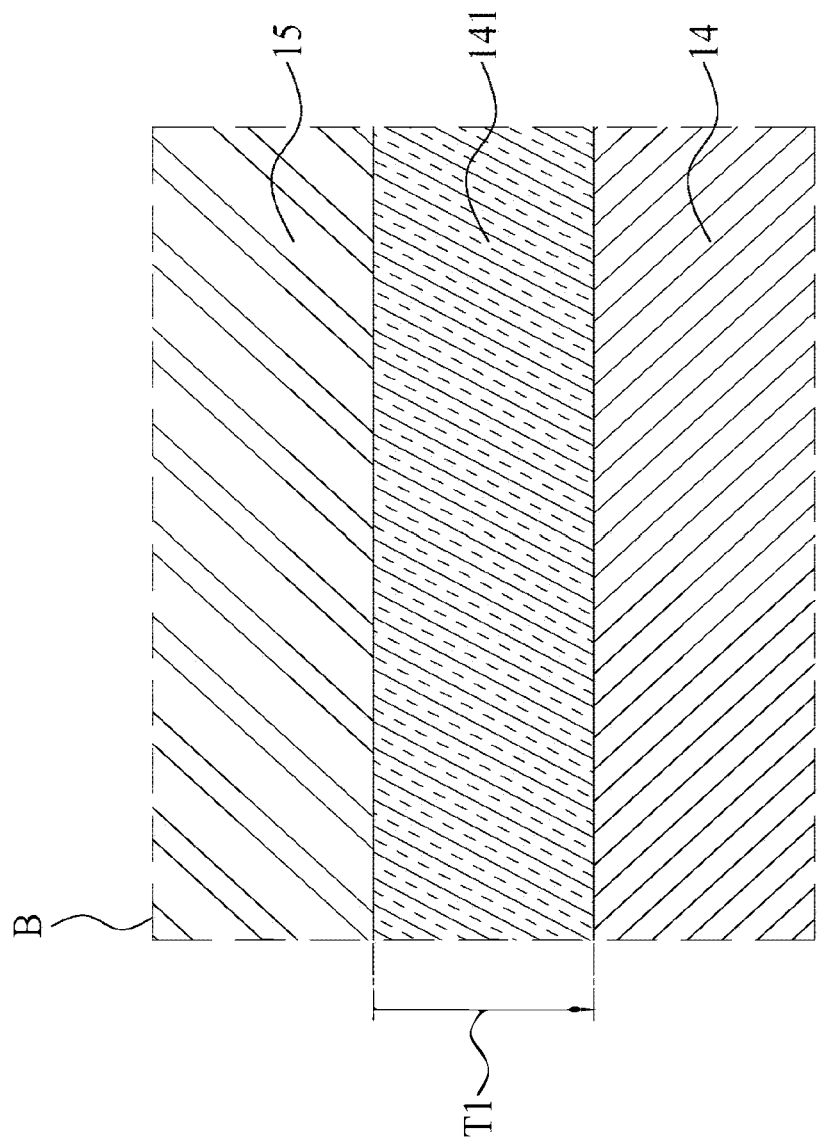
FIG. 1C is an enlarged side view of a semiconductor device according to some embodiments of the disclosure.

FIG. 1C is an enlarged side view of structure in the dotted rectangular B as shown in FIG. 1A according to some embodiments of the disclosure.

As shown in FIG. 1C, the group III-V dielectric layer 14 and the passivation layer 15 may be included in dotted rectangular B. An oxide layer 141 may exist on the group III-V dielectric layer 14.

The oxide layer 141 may be disposed in the group III-V dielectric layer 14. The oxide layer 141 may be in direct contact with the group III-V dielectric layer 14. The oxide layer 141 may be disposed between the group III-V dielectric layer 14 and the passivation layer 15. The oxide layer 141 may be disposed between the group III-V dielectric layer 14 and the passivation layer 16 (not shown in FIG. 1C).

The oxide layer 141 may have a thickness T1. The thickness T1 may include a distance between the group III-V dielectric layer 14 and the passivation layer 15. The thickness T1 may be less than 1 nm. The thickness T1 may be no greater than 1 nm. The thickness T1 may be approximately 1 nm.

It should be noted that, the oxide layer 141 may be generated due to the group III-V dielectric layer 14. It should be noted that, the oxide layer 141 may be generated due to oxidation of the group III-V dielectric layer 14. It should be noted that, the oxide layer 141 may grow from the group III-V dielectric layer 14. For example, the group III-V dielectric layer 14 may include AlN and the oxide layer 141 may include aluminum oxynitride (AlON). It is contemplated that, the oxide layer 141 is thin enough so that the quality of the group III-V dielectric layer 14 cannot be affected. It is contemplated that, the oxide layer 141 is thin enough so that the quality of the group III-V dielectric layer 14 can be maintained. It is contemplated that, the oxide layer 141 is thin enough so that the electrical quality of the group III-V dielectric layer 14 can be maintained. It should be noted that, the group III-V dielectric layer 14 may be devoid of oxygen. It should be noted that, no oxide may be present in the group III-V dielectric layer 14. It should be noted that, no oxide originated from the group III-V dielectric layer 14 may be present between the group III-V dielectric layer 14 and the passivation layer 15. It should be noted that, no oxide originated from the group III-V dielectric layer 14 may be present between the group III-V dielectric layer 14 and the passivation layer 16 (not shown in FIG. 1C). It should be noted that, the oxide layer 141 may be absent in the group III-V dielectric layer 14. It should be noted that, the oxide layer 141 may be absent between the group III-V dielectric layer 14 and the passivation layer 15. It should be noted that, the oxide layer 141 may be absent between the group III-V dielectric layer 14 and the passivation layer 16 (not shown in FIG. 1C).

FIG. 2A, FIG. 2B, FIG. 2C, FIG. 2D, FIG. 2E, and FIG. 2F show several operations for manufacturing the semiconductor device 1 as shown in FIG. 1A.

Figure 2A:
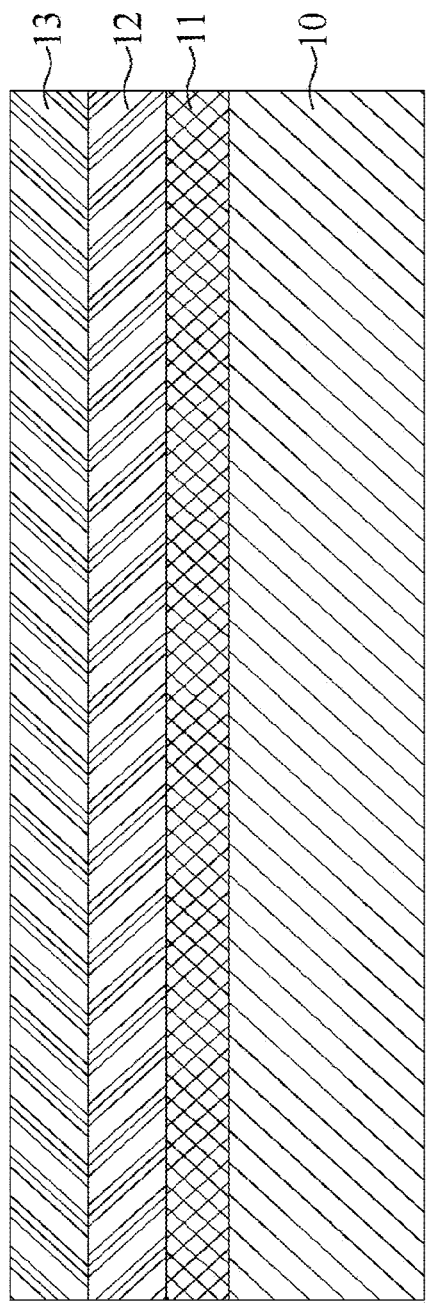
FIG. 2A, FIG. 2B, FIG. 2C, FIG. 2D, FIG. 2E, and FIG. 2F show several operations for manufacturing a semiconductor device according to some embodiments of the disclosure.

Referring to FIG. 2A, a substrate 10 may be provided. A buffer layer 11 may be formed on the substrate 10. The buffer layer 11 may be formed through chemical vapor deposition (CVD) and/or another suitable deposition step. The buffer layer 11 may be formed on the substrate 10 through CVD and/or another suitable deposition step. A semiconductor layer 12 may be formed on the buffer layer 11. The semiconductor layer 12 may be formed through CVD and/or another suitable deposition step. The semiconductor layer 12 may be formed on the buffer layer 11 through CVD and/or another suitable deposition step. A semiconductor layer 13 may be formed on the semiconductor layer 12. The semiconductor layer 13 may be formed through CVD and/or another suitable deposition step. The semiconductor layer 13 may be formed on the semiconductor layer 12 through CVD and/or another suitable deposition step.

It should be noted that, the semiconductor layer 13 may be formed after forming the semiconductor layer 12. It should be noted that, a heterojunction may be formed when the semiconductor layer 13 is disposed on the semiconductor layer 12. It should be noted that, a band gap of the semiconductor layer 13 may be greater than a band gap of the semiconductor layer 12. It should be noted that, due to the polarization phenomenon of the formed heterojunction between the semiconductor layer 13 and the semiconductor layer 12, 2DEG may be formed in the semiconductor layer 12. It should be noted that, due to the polarization phenomenon of the formed heterojunction between the semiconductor layer 13 and the semiconductor layer 12, 2DEG may be formed in the semiconductor layer 12 and close to an interface between the semiconductor layer 12 and the semiconductor layer 13.

Figure 2B:
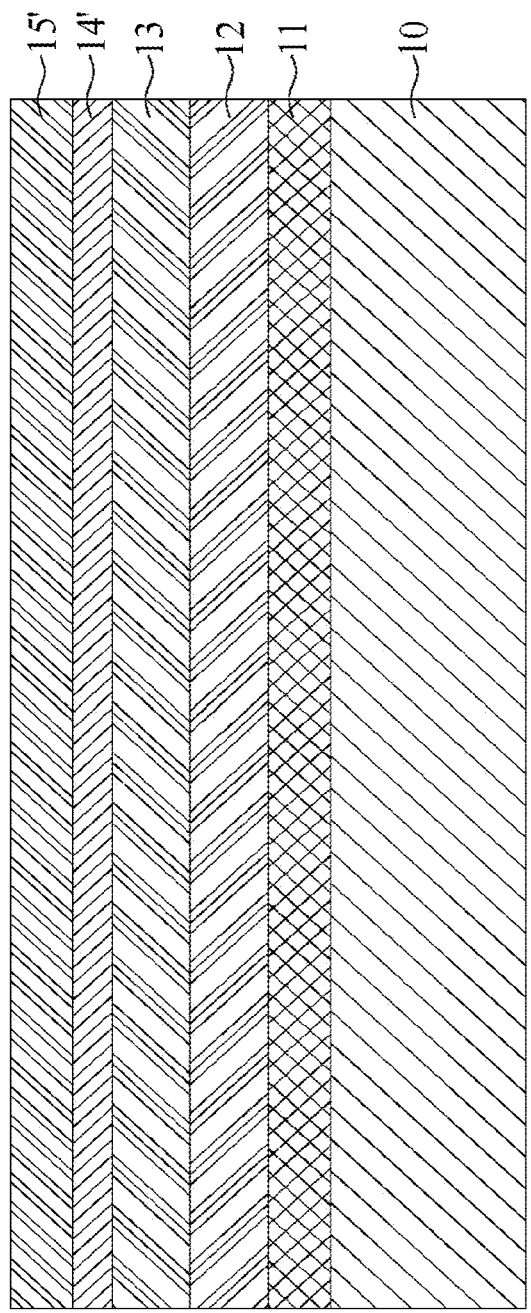

Referring to FIG. 2B, a group III-V dielectric layer 14' may be formed on the semiconductor layer 13. The group III-V dielectric layer 14' may be formed through a deposition step. The group III-V dielectric layer 14' may be formed on the semiconductor layer 13 through CVD and/or another suitable deposition step. A passivation layer 15' may be formed on the group III-V dielectric layer 14'. The passivation layer 15' may be formed through a deposition step. The passivation layer 15' may be formed on the group III-V dielectric layer 14' through CVD and/or another suitable deposition step.

It is contemplated that, the passivation layer 15' may be formed once the group III-V dielectric layer 14' is formed on the semiconductor layer 13. It is contemplated that, the passivation layer 15' may be formed after forming the group III-V dielectric layer 14'. It is contemplated that, the passivation layer 15' may be formed right after forming the group III-V dielectric layer 14'. It is contemplated that, the passivation layer 15' may be formed right after forming the group III-V dielectric layer 14' to prevent or suppress oxidation of the group III-V dielectric layer 14'.

Figure 2C:
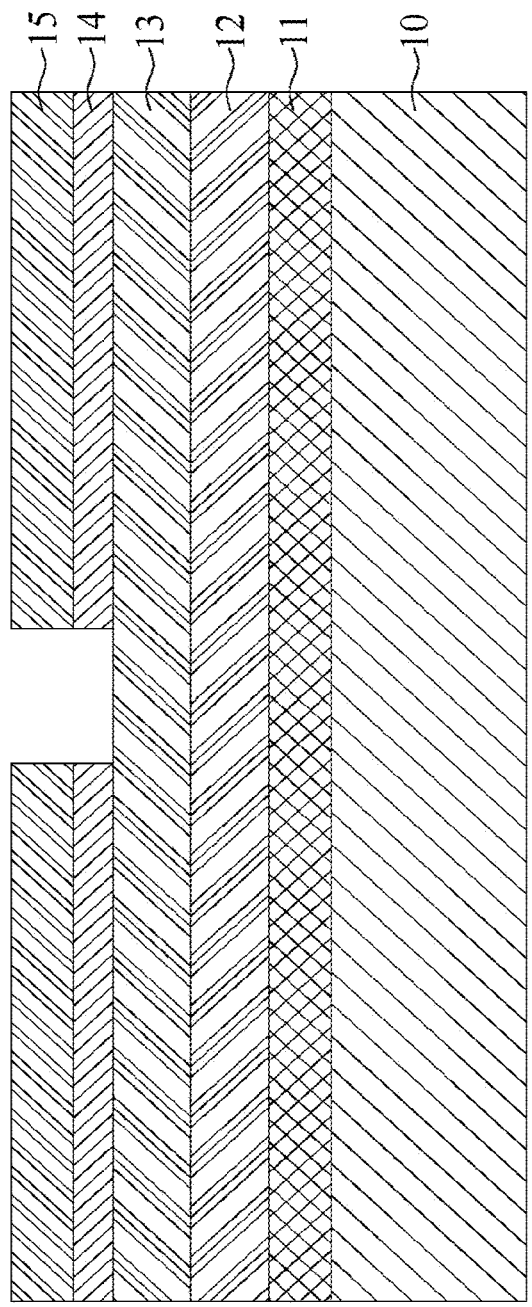

Referring to FIG. 2C, a group III-V dielectric layer 14 may be formed. The group III-V dielectric layer 14 may be formed by removing a portion of the group III-V dielectric layer 14' shown in FIG. 2B. The group III-V dielectric layer 14 may be formed by etching a portion of the group III-V dielectric layer 14' shown in FIG. 2B. A passivation layer 15 may be formed. The passivation layer 15 may be formed by removing a portion of the passivation layer 15' shown in FIG. 2B. The passivation layer 15 may be formed by etching a portion of the passivation layer 15' shown in FIG. 2B. The group III-V dielectric layer 14 and the passivation layer 15 may be formed simultaneously. The group III-V dielectric layer 14 and the passivation layer 15 may be formed simultaneously by removing a portion of the group III-V dielectric layer 14' and a portion of the passivation layer 15' shown in FIG. 2B. The group III-V dielectric layer 14 and the passivation layer 15 may be formed simultaneously to expose a portion of the semiconductor layer 13.

Figure 2D:
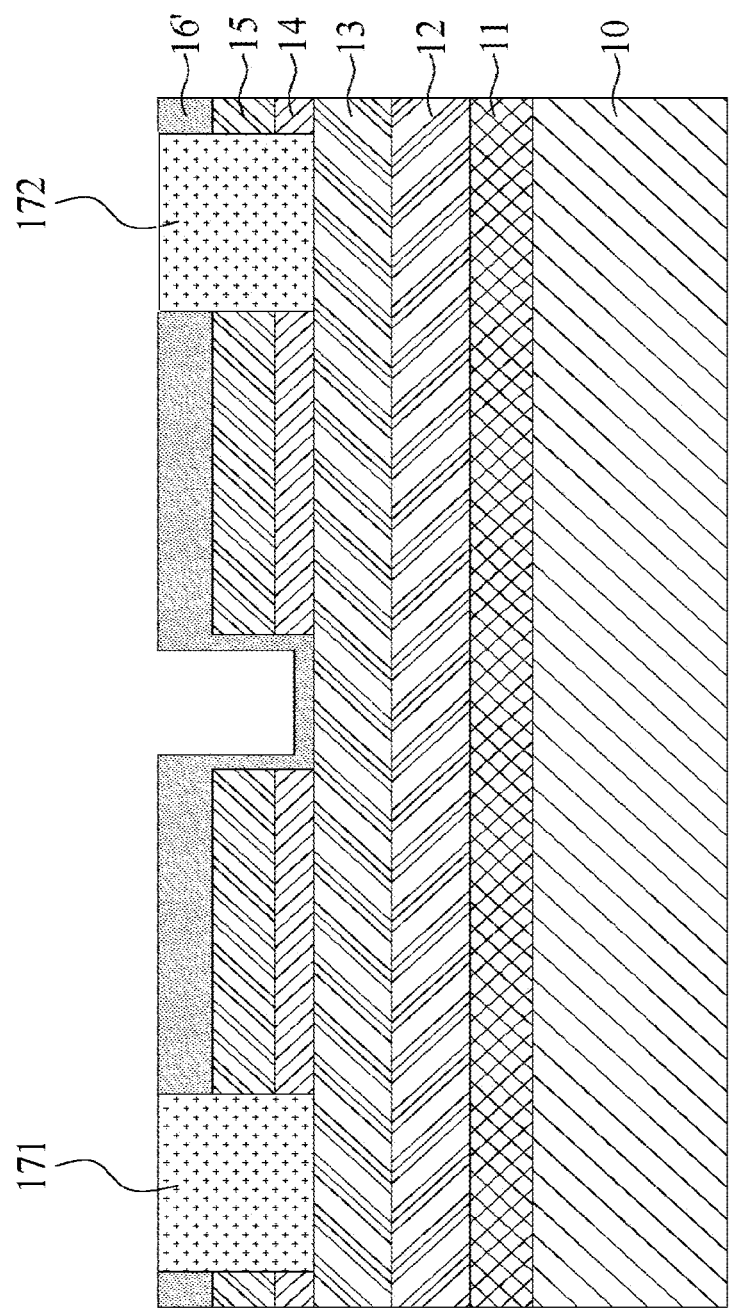

Referring to FIG. 2D, a passivation layer 16' may be formed. The passivation layer 16' may be formed through a deposition step. The passivation layer 16' may be formed on the semiconductor layer 13 through CVD and/or another suitable deposition step. The passivation layer 16' may be formed on the group III-V dielectric layer 14 through CVD and/or another suitable deposition step. The passivation layer 16' may be formed on the sidewall of the group III-V dielectric layer 14 through CVD and/or another suitable deposition step. The passivation layer 16' may be formed on the passivation layer 15 through CVD and/or another suitable deposition step. The passivation layer 16' may be formed on the sidewall of the passivation layer 15 through CVD and/or another suitable deposition step.

Also referring to FIG. 2D, a conductive structure 171 and a conductive structure 172 may be formed. The conductive structure 171 may be formed through physical vapor deposition (PVD), atomic layer deposition (ALD) and/or another suitable deposition step. The conductive structure 171 may be formed on the semiconductor layer 13. The conductive structure 171 may be formed on the semiconductor layer 13 and surrounded by the group III-V dielectric layer 14. The conductive structure 171 may be formed on the semiconductor layer 13 and surrounded by the passivation layer 15. The conductive structure 171 may be formed on the semiconductor layer 13 and surrounded by the passivation layer 16'. The conductive structure 172 may be formed through PVD, ALD and/or another suitable deposition step. The conductive structure 172 may be formed on the semiconductor layer 13. The conductive structure 172 may be formed on the semiconductor layer 13 and surrounded by the group III-V dielectric layer 14. The conductive structure 172 may be formed on the semiconductor layer 13 and surrounded by the passivation layer 15. The conductive structure 172 may be formed on the semiconductor layer 13 and surrounded by the passivation layer 16'.

Figure 2E:
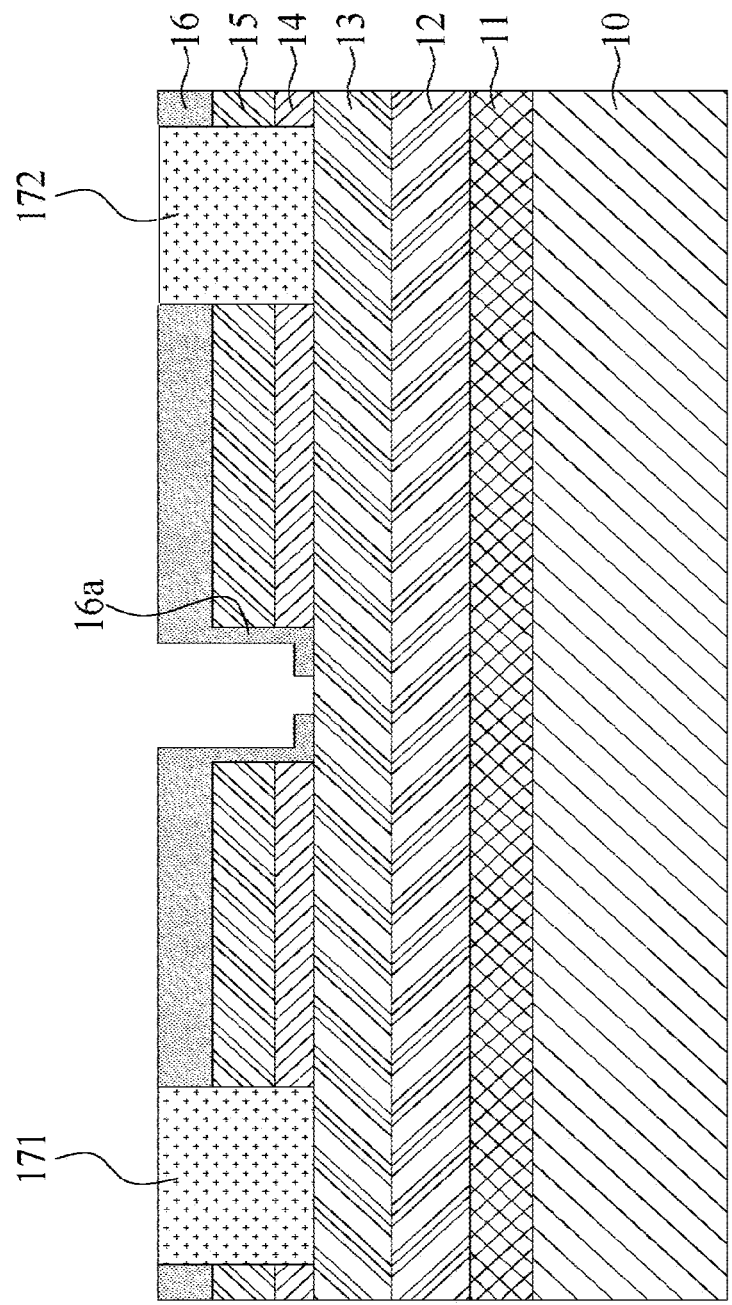

Referring to FIG. 2E, a passivation layer 16 may be formed. The passivation layer 16 may be formed by removing a portion of the passivation layer 16' shown in FIG. 2D. The passivation layer 16 may be formed by etching a portion of the passivation layer 16' shown in FIG. 2D. The passivation layer 16 may be formed to expose a portion of the semiconductor layer 13.

Also referring to FIG. 2E, a portion 16a may be defined after removing a portion of the passivation layer 16' shown in FIG. 2D. The portion 16a may be formed on the semiconductor layer 13. The portion 16a may be formed to be in direct contact with the semiconductor layer 13. The portion 16a may be formed to cover the sidewall of the group III-V dielectric layer 14. The portion 16a may be formed to be in direct contact with the sidewall of the group III-V dielectric layer 14. The portion 16a may be formed to cover the sidewall of the passivation layer 15. The portion 16a may be formed to be in direct contact with the sidewall of the passivation layer 15. The portion 16a may be formed to have at least two different lengths which are measured in a channel length direction.

Figure 2F:
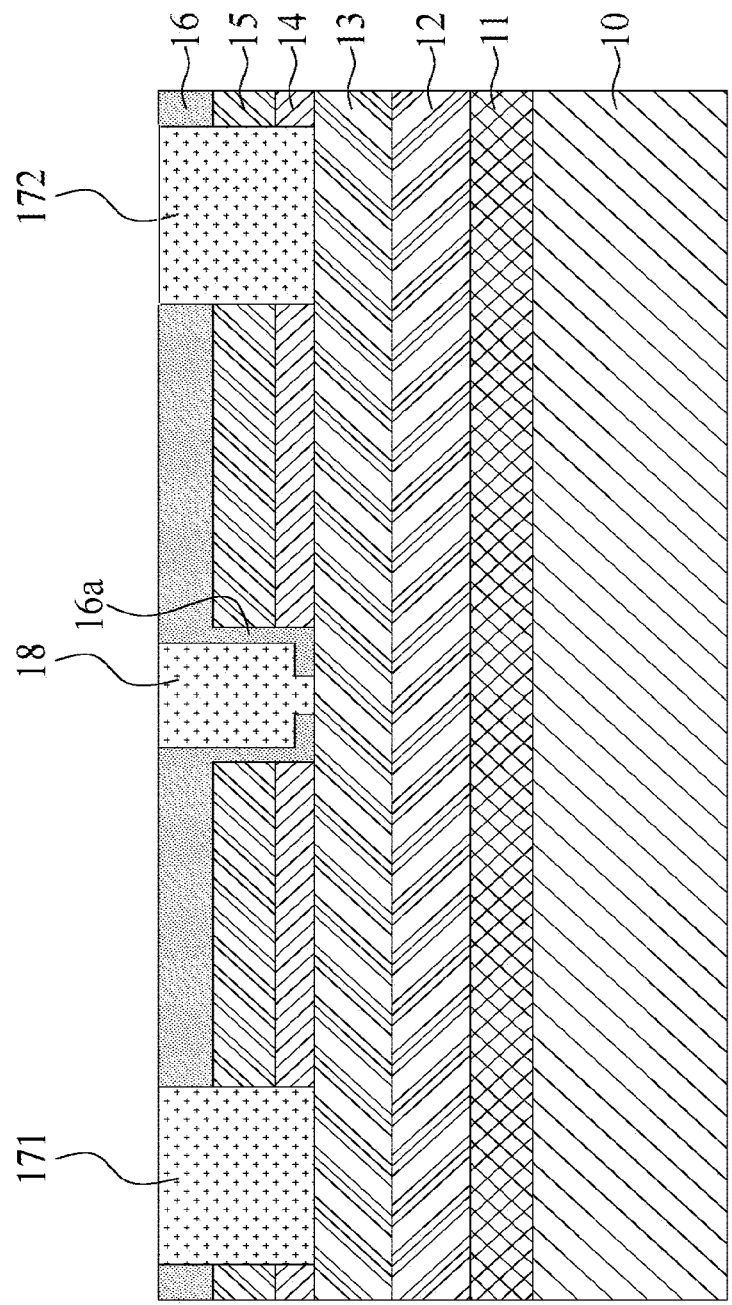

Referring to FIG. 2F, a conductive structure 18 may be formed. The conductive structure 18 may be formed through PVD, ALD and/or another suitable deposition step. The conductive structure 18 may be formed on the semiconductor layer 13. The conductive structure 18 may be formed on the exposed portion of the semiconductor layer 13 shown in FIG. 2E. The conductive structure 18 may be formed on the semiconductor layer 13 and surrounded by the passivation layer 16. The conductive structure 18 may be formed on the semiconductor layer 13 and surrounded by the portion 16a.

Figure 3:
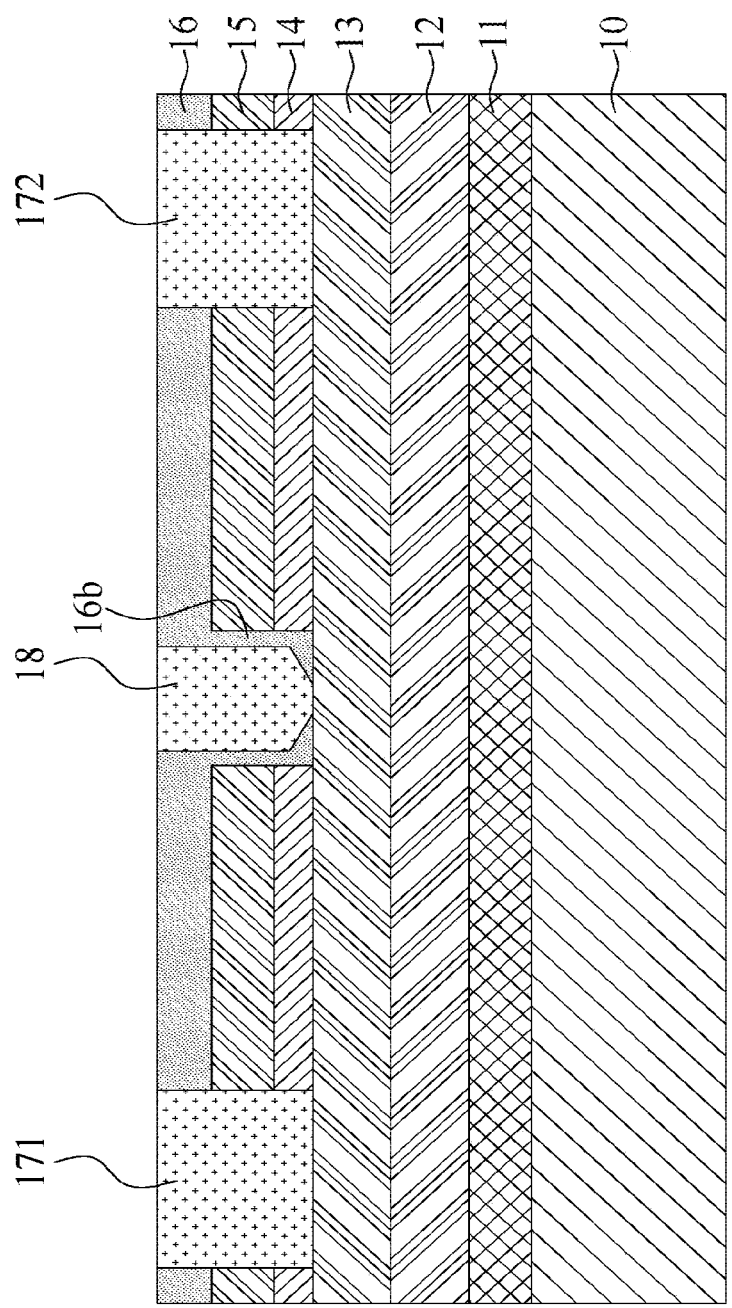
FIG. 3 is a side view of a semiconductor device according to some embodiments of the disclosure.

FIG. 3 is a side view of a semiconductor device 3 according to some embodiments of the disclosure.

The semiconductor device 3 shown in FIG. 3 is similar to the semiconductor device 1 shown in FIG. 1A, but differs in that the portion 16a shown in FIG. 1A is replaced by the portion 16b. The portion 16b may have a structure different from that of the portion 16a.

As shown in FIG. 3, the semiconductor device 3 may include a passivation layer 16. The passivation layer 16 may have a portion 16b. The portion 16b may be disposed on the semiconductor layer 13. The portion 16b may be in direct contact with the semiconductor layer 13. The portion 16b may be in direct contact with the group III-V dielectric layer 14. The portion 16b may have a sidewall in direct contact with the group III-V dielectric layer 14. The portion 16b may be in direct contact with the passivation layer 15. The portion 16b may have a sidewall in direct contact with the passivation layer 15. The portion 16b may be in direct contact with the conductive structure 18. The portion 16b may have a sidewall in direct contact with the conductive structure 18. The portion 16b may separate the conductive structure 18 from the group III-V dielectric layer 14. The portion 16b may be between the conductive structure 18 and the group III-V dielectric layer 14. The portion 16b may separate the conductive structure 18 from the passivation layer 15. The portion 16b may be between the conductive structure 18 and the passivation layer 15. The portion 16b may have multiple different lengths which are measured in a channel length direction. The distance separating the conductive structure 18 from the group III-V dielectric layer 14 may range between approximately 10 nm and approximately 500 nm. The distance separating the conductive structure 18 from the group III-V dielectric layer 14 by the portion 16b may range between approximately 10 nm and approximately 500 nm.

Also referring to FIG. 3, the conductive structure 18 may be disposed on the semiconductor layer 13. The conductive structure 18 may be in direct contact with the semiconductor layer 13. The conductive structure 18 may be in direct contact with the passivation layer 16. The conductive structure 18 may be in direct contact with the portion 16b. The conductive structure 18 may have a funnel shape structure. The conductive structure 18 may have a trapezoidal shape structure.

Figure 4:
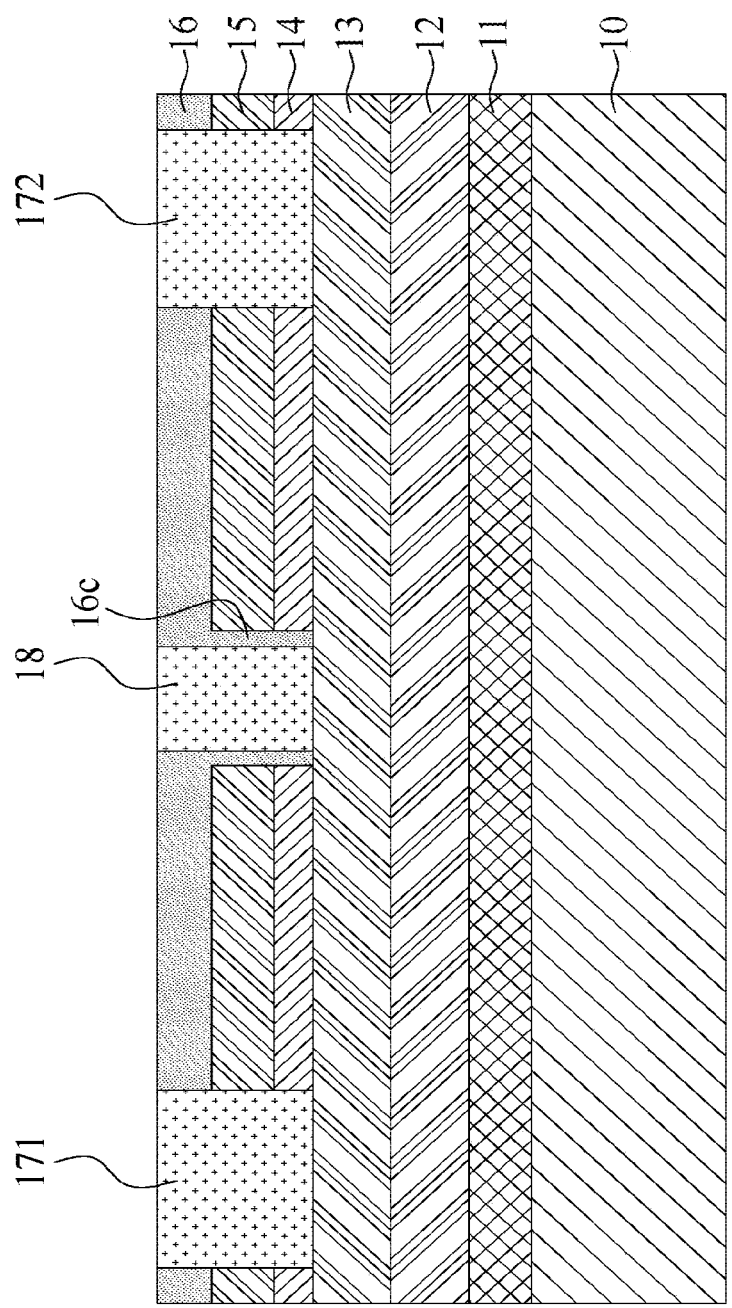
FIG. 4 is a side view of a semiconductor device according to some embodiments of the disclosure.

FIG. 4 is a side view of a semiconductor device 4 according to some embodiments of the disclosure.

The semiconductor device 4 shown in FIG. 4 is similar to the semiconductor device 1 shown in FIG. 1A, but differs in that the portion 16a shown in FIG. 1A is replaced by the portion 16c. The portion 16c may have a structure different from that of the portion 16a.

As shown in FIG. 4, the semiconductor device 4 may include a passivation layer 16. The passivation layer 16 may have a portion 16c. The portion 16c may be disposed on the semiconductor layer 13. The portion 16c may be in direct contact with the semiconductor layer 13. The portion 16c may be in direct contact with the group III-V dielectric layer 14. The portion 16c may have a sidewall in direct contact with the group III-V dielectric layer 14. The portion 16c may be in direct contact with the passivation layer 15. The portion 16c may have a sidewall in direct contact with the passivation layer 15. The portion 16c may be in direct contact with the conductive structure 18. The portion 16c may have a sidewall in direct contact with the conductive structure 18. The portion 16c may separate the conductive structure 18 from the group III-V dielectric layer 14. The portion 16c may be between the conductive structure 18 and the group III-V dielectric layer 14. The portion 16c may separate the conductive structure 18 from the passivation layer 15. The portion 16c may be between the conductive structure 18 and the passivation layer 15. The portion 16c may a substantially consistent length which is measured in a channel length direction. The distance separating the conductive structure 18 from the group III-V dielectric layer 14 may range between approximately 10 nm and approximately 500 nm. The distance separating the conductive structure 18 from the group III-V dielectric layer 14 by the portion 16c may range between approximately 10 nm and approximately 500 nm.

Also referring to FIG. 4, the conductive structure 18 may be disposed on the semiconductor layer 13. The conductive structure 18 may be in direct contact with the semiconductor layer 13. The conductive structure 18 may be in direct contact with the passivation layer 16. The conductive structure 18 may be in direct contact with the portion 16c. The conductive structure 18 may have a rectangular shape structure.

Figure 5:
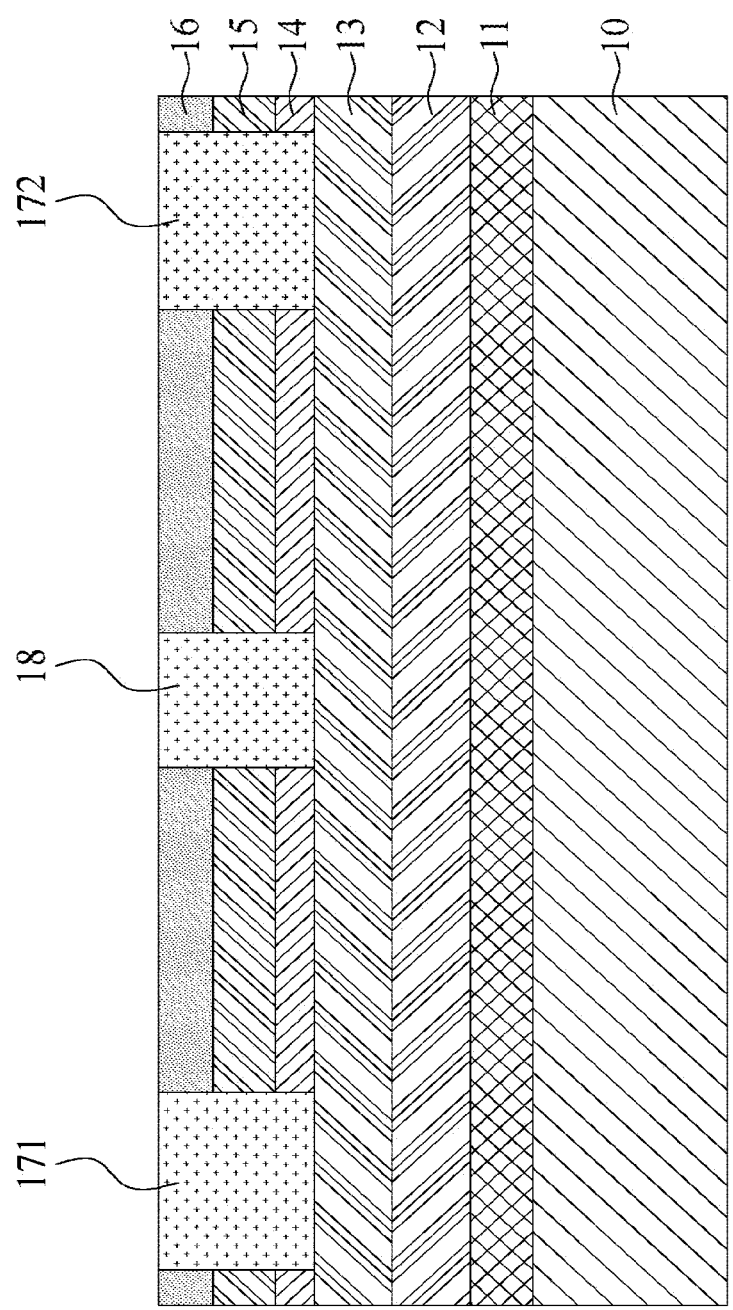
FIG. 5 is a side view of a semiconductor device structure according to some other embodiments of the disclosure.

FIG. 5 is a side view of a semiconductor device 5 according to some other embodiments of the disclosure.

The semiconductor device 5 shown in FIG. 5 may have a structure similar to the structure of the semiconductor device 1 shown in FIG. 1A. The semiconductor device 5 may not have any portion separating the conductive structure 18 from the group III-V dielectric layer 14. The semiconductor device 5 may not have any portion between the conductive structure 18 and the group III-V dielectric layer 14. The conductive structure 18 may be in direct contact with the group III-V dielectric layer 14. The conductive structure 18 may be in direct contact with the group III-V dielectric layer 14 and the semiconductor layer 13.

It should be noted that, if the group III-V dielectric layer 14 is in direct contact with the semiconductor layer 13 and the conductive structure 18 which is used as a gate electrode, the carriers, such as electrons, may enter the conductive structure 18. It should be noted that, if the group III-V dielectric layer 14 is in direct contact with the semiconductor layer 13 and the conductive structure 18 which is used as a gate electrode, the electrons may enter the conductive structure 18 from the drain (such as the conductive structure 172) when a positive voltage is applied to the conductive structure 18. It should be noted that, if the group III-V dielectric layer 14 is in direct contact with the semiconductor layer 13 and the conductive structure 18 which is used as a gate electrode, the carriers, such as holes, may enter the conductive structure 18. It should be noted that, if the group III-V dielectric layer 14 is in direct contact with the semiconductor layer 13 and the conductive structure 18 which is used as a gate electrode, the carriers may enter the conductive structure 18 from the drain. It should be noted that, if the group III-V dielectric layer 14 is in direct contact with the semiconductor layer 13 and the conductive structure 18 which is used as a gate electrode, a gate leakage current may occur. It should be noted that, if the group III-V dielectric layer 14 is in direct contact with the semiconductor layer 13 and the conductive structure 18 which is used as a gate electrode, a gate leakage current may occur due to the conduction band falling of the semiconductor layer 13. It should be noted that, if the group III-V dielectric layer 14 is in direct contact with the semiconductor layer 13 and the conductive structure 18 which is used as a gate electrode, a gate leakage current may occur due to the conduction band falling of the semiconductor layer 13 under the conductive structure 18.

As used herein, for ease of description, space-related terms such as "under", "below", "lower portion", "above", "upper portion", "lower portion", "left side", "right side", and the like may be used herein to describe a relationship between one component or feature and another component or feature as shown in the figures. In addition to orientations shown in the figures, space-related terms are intended to encompass different orientations of the device in use or operation. A device may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used herein, terms "approximately", "basically", "substantially", and "about" are used for describing and considering a small variation. When being used in combination with an event or circumstance, the term may refer to a case in which the event or circumstance occurs precisely, and a case in which the event or circumstance occurs approximately. As used herein with respect to a given value or range, the term "about" generally means in the range of +10%, +5%, +1%, or +0.5% of the given value or range. The range may be indicated herein as from one endpoint to another endpoint or between two endpoints. Unless otherwise specified, all the ranges disclosed in the disclosure include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within +10%, +5%, +1%, or +0.5% of the average of the values.

Several embodiments of the disclosure and features of details are briefly described above. The embodiments described in the disclosure may be easily used as a basis for designing or modifying other processes and structures for realizing the same or similar objectives and/or obtaining the same or similar advantages introduced in the embodiments of the disclosure. Such equivalent constructions do not depart from the spirit and scope of the disclosure, and various variations, replacements, and modifications can be made without departing from the spirit and scope of the disclosure.

What is claimed is:

1. A semiconductor device, comprising:
   a substrate;
   a first nitride semiconductor layer on the substrate;
   a second nitride semiconductor layer on the first nitride semiconductor layer and having a band gap greater than a band gap of the first nitride semiconductor layer;
   a gate electrode having a first portion with a first length and in direct contact with the second nitride semiconductor layer, and a second portion with a second length different from the first length and on the first portion; and
   a passivation layer disposed on the second nitride semiconductor layer,
   wherein the first length and the second length are measured in a channel length direction, and
   wherein the passivation layer has a sidewall in direct contact with the second nitride semiconductor layer, the first portion of the gate electrode and the second portion of the gate electrode.

2. The semiconductor device according to claim 1, wherein the second length is greater than the first length.

3. The semiconductor device according to claim 1, further comprising:
   a group III-V dielectric layer in direct contact with the second nitride semiconductor layer.

4. The semiconductor device according to claim 3, wherein the passivation layer separates the gate electrode from the group III-V dielectric layer.

5. The semiconductor device according to claim 3, wherein the group III-V dielectric layer includes aluminum nitride (AlN).

* * * * *